United States Patent [19]

Kong et al.

[11] Patent Number: 5,128,674
[45] Date of Patent: Jul. 7, 1992

[54] TWO QUADRANTS HIGH SPEED MULTIPLYING DAC

[75] Inventors: Kam W. Kong, West Covina; John M. Burns, Harbor City; Tim M. Ng, Monterey Park, all of Calif.

[73] Assignee: Hughes Aircraft Company, Los Angeles, Calif.

[21] Appl. No.: 676,635

[22] Filed: Mar. 28, 1991

[51] Int. Cl.$^5$ ............................................. H03M 1/80
[52] U.S. Cl. .................................. 341/127; 341/135; 341/153
[58] Field of Search .................. 341/127, 135, 153, 154, 341/144

[56] References Cited

U.S. PATENT DOCUMENTS 4,563,670 1/1986 Stallkamp et al. ................. 341/119
4,982,192 1/1991 Murooka ............................ 341/127

OTHER PUBLICATIONS

"Monolithic Multiplying 8-bit DACs Offer High Speed Performance", Computer Design, Feb. 1977, p. 138.

Primary Examiner—A. D. Pellinen
Assistant Examiner—Sharon D. Logan
Attorney, Agent, or Firm—Leonard A. Alkov; Wanda K. Denson-Low

[57] ABSTRACT

A multiplying digital-to-analog converter for multiplying a bipolar input current by a digital word A having N bits $a_i$ including a current adder for adding a constant current to the bipolar input current to produce a unipolar current, a first current mirror responsive to the unipolar current for providing N binary weighted versions of the unipolar current, a second current mirror for providing binary weighted versions of the constant current, N current selection circuits respectively controlled the N bits $a_i$ for providing an output current comprising (a) the correspondingly weighted version of said unipolar current if the associated control bit is in a first state or (b) the correspondingly weighted version of the constant current if the associated control bit is in a second state, and a shifting circuit for summing the outputs of said N current selection means and for shifting the sum current to produce a bipolar output current representative of product of (a) the input bipolar current and (b) the digital word A.

6 Claims, 3 Drawing Sheets

1

TWO QUADRANTS HIGH SPEED MULTIPLYING DAC

BACKGROUND OF THE INVENTION

The disclosed invention is directed generally to multiplying digital-to-analog converters (DACs), and is directed more particularly to a two quadrant multiplying DAC.

A multiplying DAC multiplies an analog signal (e.g., a current) by discrete gain factor represented by a digital word to provide an output analog signal. Conventional multiplying DACs perform single quadrant multiplication wherein the input analog signal is unipolar and the output analog signal is also unipolar.

Two quadrant multiplication is commonly achieved with two conventional multiplying DACs, one for each polarity of the input signal. One of the multiplying DACs can be implemented with NPN current switches and the other can be implemented with PNP current switches. Considerations with PNP transistor multiplying DAC implementations, however, include speed and resolution limitations.

SUMMARY OF THE INVENTION

It would therefore be an advantage to provide a bipolar multiplying DAC that does not include two unipolar multiplying DACs.

Another advantage would be to provide a two quadrant multiplying DAC that has improved operating speed and resolution.

The foregoing and other advantages are provided by the invention in a multiplying digital-to-analog converter for multiplying a bipolar input current by a discrete gain factor K represented by a digital word A having N bits $a_i$. The multiplying digital-to-analog converter includes a current adder for adding a constant current to the bipolar input current to produce a unipolar current, a first current mirror responsive to the unipolar current for providing N binary weighted versions of the unipolar current, a second current mirror for providing binary weighted versions of the constant current added to the bipolar input current, N current selection circuits respectively controlled by the N bits $a_i$ for providing an output current comprising (a) the correspondingly weighted version of said unipolar current if the associated control bit is in a first state, or (b) the correspondingly weighted version of the constant current if the associated control bit is in a second state, and a shifting circuit for summing the outputs of said N current selection means and for shifting the sum current to produce a bipolar output current representative of product of (a) the input bipolar current and (b) the digital word A.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
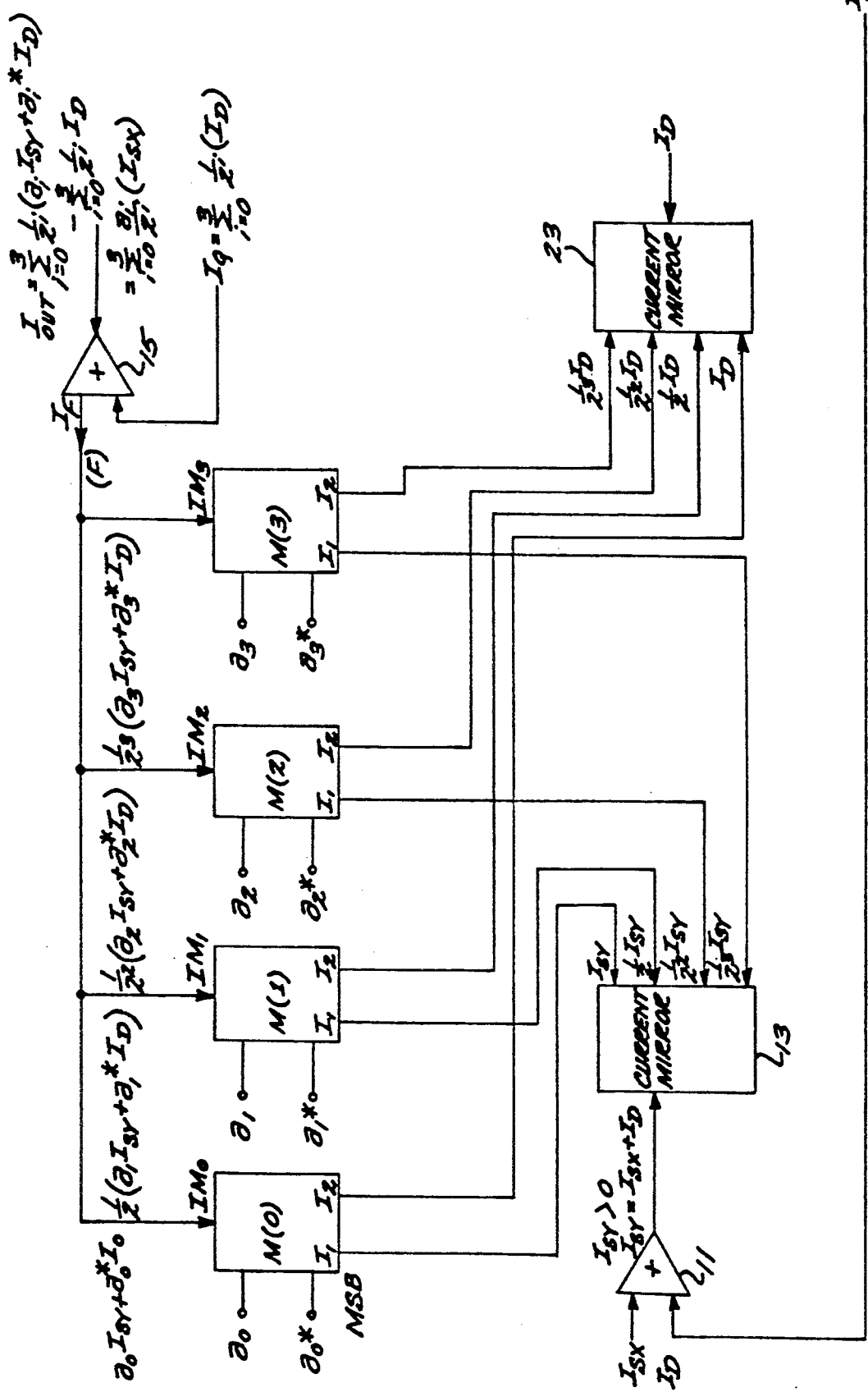
FIG. 1 is a block diagram of a 4-bit multiplying DAC in accordance with the invention.

In the following detailed description and in the several figures of the drawing, like elements are identified with like reference numerals.

Referring now to FIG. 1, shown therein is an illustrative example of a multiplying DAC in accordance with the invention. In particular, set forth therein is a 4-bit multiplying DAC which includes a current adder 11 for summing a variable bipolar input current $I_{SX}$ and a constant positive reference current $I_D$, where $I_D$ is selected such that:

$$I_{SX} + I_D \geq 0 \qquad \text{(Equation 1)}$$

for all expected values of the variable bipolar current $I_{SX}$. In particular, if the reference current $I_D$ is selected to be equal to the maximum absolute value of $I_{SX}$, the current adder 11 converts the bipolar current $I_{SX}$ to a positive current $I_{SY}$ having its reference point translated from 0 to $I_D$. For reference, positive current flow is in the direction of the arrows in the figures of the drawings.

The output current $I_{SY}$ of the current adder 11 is provided to a positive current mirror 13 which provides binary weighted currents $IS_i$ which are respectively $(\frac{1}{2})^0 I_{SY}$ (i.e., $I_{SY}$), $(\frac{1}{2})I_{SY}$, $(\frac{1}{2})^2 I_{SY}$, $(\frac{1}{2})^3 I_{SY}$, which can be represented as:

$$IS_i + (\frac{1}{2})^i I_{SY} \qquad \text{(Equation 2)}$$

for i=0 to 3, where one current is provided for each of the bits in the digital control word A. For later analysis it should be appreciated that each of the current mirror outputs $IS_i$ can also be expressed as follows:

$$(\frac{1}{2})^i I_{SY} + (\frac{1}{2})^i (I_{SX} + I_D) \qquad \text{(Equation 3)}$$

The currents generated by the positive current mirror 13 provide respective first inputs $I_1$ for respective current selection cells M(0), M(1), M(2), M(3). The current selection cells are respectively controlled by the bits $a_i$ of the digital control word A, with the most significant bit $a_0$ controlling the MSB current selection cell M(0) and the least significant bit $a_3$ controlling the LSB current selection cell M(3). The notation as to the bits of the control word A may be regarded as being the reverse of the common notation wherein the MSB has the larger subscript, but the particular notation utilized herein has been selected to facilitate the explanation of the relation between the weighted currents and the bits of the control word.

In particular as to the inputs $I_1$ to the current selection cells M(i) from the positive current mirror 13, the cells receive the binary weighted currents in accordance with the weights of the associated control bits. Thus, the MSB current selection cell M(0) receives the largest current $I_{SY}$, and the current selection cell M(3) receives the smallest current $(\frac{1}{2})^3 I_{SY}$.

The respective second inputs $I_2$ for the current selection cells are provided by binary weighted constant currents produced by another positive current mirror 23 whose input is provided by the positive reference current $I_D$. The positive current mirror 23 provides binary weighted constant currents $IC_i$ which are respectively $(\frac{1}{2})^0 I_D$ (i.e., $I_D$), $(\frac{1}{2})^1 I_D$, $(\frac{1}{2})^2 I_D$, $(\frac{1}{2})^3 I_D$, and which can be represented as:

$$IC_i = (\tfrac{1}{2})^i I_D \qquad \text{(Equation 4)}$$

where one current is provided for each of the bits in the digital control word A. The current selection cells receive respective weighted currents from the positive current mirror 23 in accordance with the weights of the associated control bits of the control word A.

Each of the current selection cells M(i), i=0,3, produces a current output $IM_i$ that is a function of the value of its control bit:

$$IM_i = a_i (\tfrac{1}{2})^i I_{SY} + a_i^* (\tfrac{1}{2})^i I_D \qquad \text{(Equation 5)}$$

where $a_i^*$ is the complement of $a_i$, and where i=0,3 and identifies the weight of the control bits and the current inputs to the current selection cells. In other words, the cell output is (a) the weighted version of the constant current $I_D$ when the control bit is 0, or (b) the weighted version of the shifted current $I_{SY}$ when the control bit is 1.

The outputs of the current selection cells are summed at the node F to provide the input current $I_F$ to a current adder 15:

$$I_F = \sum_{i=0}^{N-1} (\tfrac{1}{2})^i (a_i \cdot I_{SY} + a_i^* \cdot I_D) \qquad \text{(Equation 6)}$$

The other input to the current adder 15 is a constant current $I_Q$ that is opposite in reference direction relative to the current $I_F$, and the output $I_{OUT}$ is:

$$I_{OUT} = \sum_{i=0}^{N-1} (\tfrac{1}{2})^i (a_i \cdot I_{SY} + a_i^* \cdot I_D) - I_Q \qquad \text{(Equation 7)}$$

The adder 15 together with the oppositely referenced input currents effectively provides a subtraction function, and the constant current $I_Q$ is selected to be the sum of the binary weighted constant currents provided by the positive current mirror 23 so that the output $I_{OUT}$ of the current adder 15 is expressed as follows:

$$I_{OUT} = \sum_{i=0}^{N-1} (\tfrac{1}{2})^i (a_i \cdot I_{SY} + a_i^* \cdot I_D) - \sum_{i=0}^{N-1} (\tfrac{1}{2})^i I_D \qquad \text{(Equation 8)}$$

$$I_{OUT} = \sum_{i=0}^{N-1} (\tfrac{1}{2})^i (a_i \cdot I_{SY} + a_i \cdot I_D - I_D) \qquad \text{(Equation 9)}$$

$$I_{OUT} = \sum_{i=0}^{N-1} (\tfrac{1}{2})^i [a_i \cdot I_{SY} - I_D (1 - a_i^*)] \qquad \text{(Equation 10)}$$

$$I_{OUT} = \sum_{i=0}^{N-1} (\tfrac{1}{2})^i (a_i \cdot I_{SY} - a_i \cdot I_D) \qquad \text{(Equation 11)}$$

$$I_{OUT} = \sum_{i=0}^{N-1} (\tfrac{1}{2})^i a_i (I_{SY} - I_D) \qquad \text{(Equation 12)}$$

$$I_{OUT} = \sum_{i=0}^{N-1} (\tfrac{1}{2})^i a_i (I_{SX}) \qquad \text{(Equation 13)}$$

The last expression for $I_{OUT}$ precisely states the function of the multiplying DAC, which is multiplication of the bipolar input current $I_{SX}$ by a discrete gain factor K that is settable by digital control:

$$K = \sum_{i=0}^{N-1} (\tfrac{1}{2})^i (a_i) \qquad \text{(Equation 14)}$$

It should be appreciated that a current subtractor could be utilized in place of the current adder 15, in which case the input currents would have the same reference direction.

The principles of operation of the disclosed multiplying DAC 10 are as follows. The desired output is expressed in foregoing Equation 13, which indicates that the desired bipolar output is the sum of the weighted versions of the bipolar input current which have non-zero control bits. In other words, the contribution to the bipolar output current for a 1 control bit is the corresponding weighted version of the bipolar input current while the contribution for a 0 control bit is 0 current.

Examining the outputs of the positive current mirror reveals that each weighted current mirror output $IS_i$ (i.e., $(\tfrac{1}{2})^i I_{SY}$) is the sum of (a) the corresponding weighted version of the input bipolar current $I_{SX}$ and (b) the corresponding weighted version of the constant current $I_D$ as shown in Equation 3 above. For a 0 control bit, the contribution to the bipolar output is 0. Thus, the contribution for each control bit can be provided by (a) subtracting the corresponding weighted version of the constant current from the current mirror output if the control bit is 1, or (b) providing 0 current if the control bit is 0. The respective contributions are then added to produce the appropriate bipolar output.

It should be appreciated that as a result of the transitive property of addition and subtraction, the subtraction of the binary weighted version of the constant current can take place after addition of the contributions for the control bits.

The subtraction necessary for each control bit equal to 1 is provided by the subtraction circuit 15 wherein the sum of weighted versions of the constant current is subtracted from the summed current $I_F$, whereby a subtrahend is provided for each of the control bits, as shown by Equation 8 above. Since that subtraction always takes place, the minuend for a 0 control bit is set to the corresponding weighted version of the constant current so that the subtraction for such 0 control bit results in 0 current. The appropriate minuend for each control bit is provided by the associated current selector circuit M(i).

In summary, each current selection cell provides the a current output under the control of its control bit such that the contribution to the unipolar current sum $I_F$ for that control bit is (a) the weighted version of the constant current when the control bit is 0, or (b) the sum of the weighted version of the input bipolar current and the weighted version of the constant current when the control bit is 1. This allows for subtraction of a constant equal to the weighted version of the constant current, whereby the contribution to the bipolar current output of the multiplying DAC for that control bit is either (a) 0 when the control bit is 0, or (b) the weighted version of the input bipolar current when the control bit is 1, which is in accordance with the desired result of a multiplying DAC as defined by Equations 13 and 14 above. In other words, the current selection cells provide currents having the appropriate shifts that can be removed by the subtraction circuit to arrive at the appropriate contribution to the bipolar output current.

The components of a bipolar multiplying DAC in accordance with the invention are readily implemented with circuitry comprising NPN transistors, resistors, and capacitors and is amenable to integrated circuit implementation.

Figure 2:
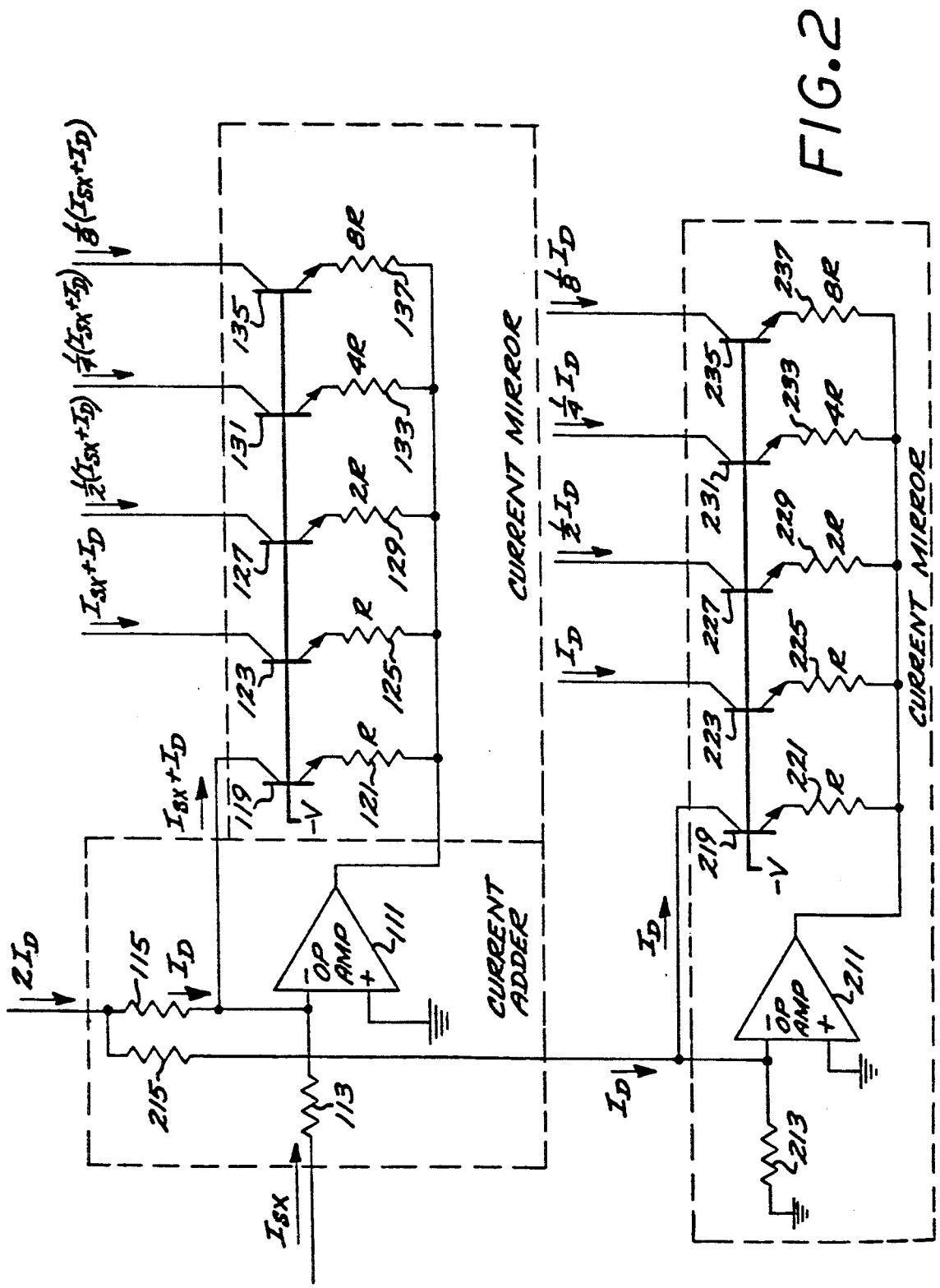
FIG. 2 is a circuit schematic of an implementation of the input current adder and the current mirrors of the multiplying DAC of FIG. 1.

An example of an implementation of the current adder 11, the positive current mirror 13, and the positive current mirror 23 is schematically depicted in FIG. 2. The current adder includes an operational amplifier 111 which has its non-inverting input connected to ground. The bipolar input current $I_{SX}$ and the constant current $I_D$ are summed at the inverting input of the Operational amplifier 111 and are provided via resistors 113 and 115. The current through the resistor 115 is $I_D$ as a result of splitting a current $2I_D$ by the resistor 115 and an equally valued resistor 215 which also provides a current $I_D$ that is utilized by the current mirror 23 as discussed further herein.

The positive current mirror 13 includes an NPN transistor 119 which receives the sum of the bipolar input current $I_{SX}$ and the constant current $I_D$ at its collector which is connected to the inverting input of the operational amplifier 111. The base of the transistor 119 is connected to a source of negative potential $-V$, and the emitter of the transistor 119 is coupled to the output of the operational amplifier 111 via a resistor having a value R. The positive current mirror further includes a second NPN transistor 123 which has its base connected to the source of negative potential $-V$, and has its emitter coupled to the output of the operational amplifier 111 via resistor 125 having the value R. The collector current of the NPN transistor 123 comprises the sum of the input bipolar current $I_{SX}$ and the constant current $I_D$ (i.e., $(\frac{1}{2})^0 I_{SY}$).

A third NPN transistor 127 has its base connected to the source of negative potential $-V$, and has its emitter coupled to the output of the operational amplifier 111 via a resistor 129 having a value 2R. The collector current of the NPN transistor 127 comprises one-half the sum of the input bipolar current $I_{SX}$ and the constant current $I_D$ (i.e., $(\frac{1}{2})^1 I_{SY}$).

A fourth NPN transistor 131 has its base connected to the source of negative potential $-V$, and has its emitter coupled to the output of the operational amplifier 111 via a resistor 133 having a value 4R. The collector current of the NPN transistor 131 comprises one-fourth the sum of the input bipolar current $I_{SX}$ and the constant current $I_D$ (i.e., $(\frac{1}{2})^2 I_{SY}$).

A fifth NPN transistor 135 has its base connected to the source of negative potential $-V$, and has its emitter coupled to the output of the operational amplifier 111 via a resistor 137 having a value 8R. The collector current of the NPN transistor 135 comprises one-eighth the sum of the input bipolar current $I_{SX}$ and the constant current $I_D$ (i.e., $(\frac{1}{2})^3 I_{SY}$).

The positive current mirror 23 includes an operational amplifier 211 which has its non-inverting input coupled to ground via a resistor 213. The inverting input of the operational amplifier 211 is further connected to the resistor 215 which provides a constant current $I_D$ as discussed above relative to the current mirror 13. The collector of a first NPN transistor 219 is connected to the inverting input of the operational amplifier 211 and receives the constant current $I_D$. The base of the transistor 219 is connected to a source of negative potential $-V$, and the emitter of the transistor 219 is coupled to the output of the operational amplifier 211 via a resistor having a value R. The positive current mirror 23 further includes a second NPN transistor 223 which has its base connected to the source of negative potential $-V$, and has its emitter coupled to the output of the operational amplifier 211 via resistor 225 having the value R. The collector current of the NPN transistor 223 comprises the constant current $I_D$ (i.e., $(\frac{1}{2})^0 I_D$).

A third NPN transistor 227 has its base connected to the source of negative potential $-V$, and has its emitter coupled to the output of the operational amplifier 211 via a resistor 229 having a value 2R. The collector current of the NPN transistor 127 comprises one-half the constant current $I_D$ (i.e., $(\frac{1}{2})^1 I_D$).

A fourth NPN transistor 231 has its base connected to the source of negative potential $-V$, and has its emitter coupled to the output of the operational amplifier 211 via a resistor 233 having a value 4R. The collector current of the NPN transistor 231 comprises one-fourth the constant current $I_D$ (i.e., $(\frac{1}{2})^2 I_D$).

A fifth NPN transistor 235 has its base connected to the source of negative potential $-V$, and has its emitter coupled to the output of the operational amplifier 211 via a resistor 237 having a value 8R. The collector current of the NPN transistor 235 comprises one-eighth the constant current $I_D$ (i.e., $(\frac{1}{2})^3 I_D$).

It is noted that the positive current mirror 23 can be implemented without the operational amplifier 211. The bases of the NPN transistors would be together but not to $-V$. In particular, the bases of the transistors together with the collector of the NPN transistor 219 would be connected together to an adjustable resistor that is connected to a reference voltage and adjusted to provide the constant current $I_D$. The resistors on the emitters of the NPN transistors would be connected to a negative potential.

Figure 3:
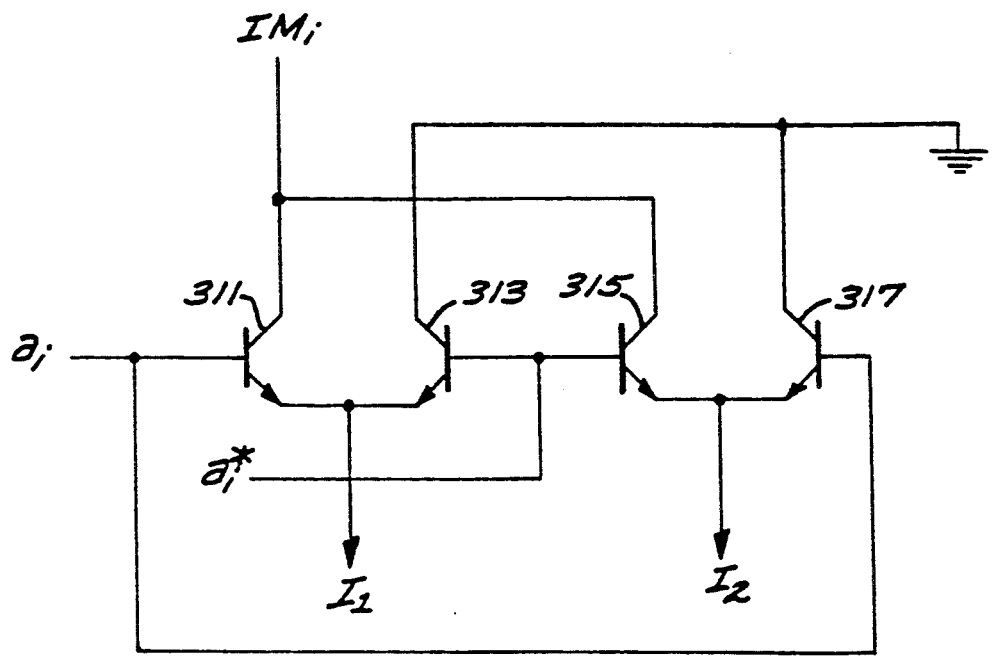
FIG. 3 is a circuit schematic of an implementation of a multiplying cell cf the multiplying DAC of FIG. 1.

An example of an embodiment of a current selection cell is set forth in FIG. 3. The current selection cell includes differentially driven NPN transistors 311, 313 which provide the current $I_1$ at their commonly connected emitters. Further differentially driven NPN transistors 315, 317 provide the current $I_2$ at their commonly connected emitters. The collectors of the transistors 313, 317 are connected to ground, while the collectors of the transistor 311, 315 provide the output current $I_O$. The bases of the transistors 311, 317 are commonly connected to receive the control bit $a_i$ while the bases of the transistors 313, 315 are commonly connected to receive the control bit complement $a_i^*$. In terms of utilization in the circuit of FIG. 1, the current $I_1$ is provided by the binary weighted versions of the shifted input current $I_{SY}$ as generated by the current mirror 13, and the current $I_2$ is provided by the binary weighted versions of the constant current $I_D$ as generated by the positive current mirror 23. The current selector output is connected to the node F.

Figure 4:
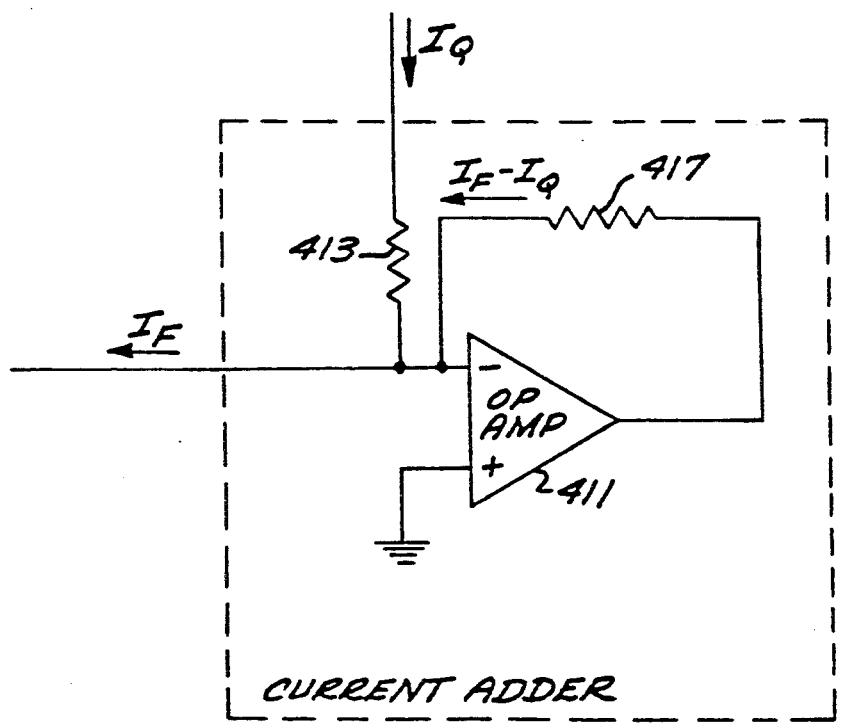
FIG. 4 is a circuit schematic of an implementation of the output current adder of the multiplying DAC of FIG. 1.

An example of an embodiment of the current adder 15 is schematically depicted in FIG. 4. The current adder includes an operational amplifier 411 which has its noninverting input connected to ground. The current $I_F$ and the current $I_Q$ (which are opposite in reference direction) are summed at the inverting input of the operational amplifier, with the current $I_Q$ being provided via a resistor 413. A resistor 417 is connected between the inverting input of the operational amplifier 411 and its output, and the current through the resistor 417 is the sum of the currents. Since the input currents are of opposite reference directions, the current adder 15 effectively subtracts the current $I_Q$ from the current $I_F$.

The foregoing has been a disclosure of a two quadrant multiplying DAC that avoids the use of two unipolar multiplying DACs by shifting the input bipolar signal to provide unipolar processing to provide a multiplied unipolar signal that is shifted to produce the desired bipolar output. The disclosed multiplying DAC is amenable to integrated circuit implementation, can be implemented without the use of PNP transistors, and provides for improved operating speed and resolution.

Although the foregoing has been a description and illustration of specific embodiments of the invention, various modifications and changes thereto can be made by persons skilled in the art without departing from the scope and spirit of the invention as defined by the following claims.

What is claimed is:

1. A multiplying digital-to-analog converter for multiplying a bipolar input signal by a discrete gain factor K represented by a digital word A having N bits $a_i$, comprising:
   adding means responsive to the bipolar input signal for adding a constant signal to the bipolar signal to produce a unipolar signal;
   first weighting means responsive to said unipolar signal for providing N binary weighted versions of said unipolar signal;
   second weighting means for providing N binary weighted versions of the constant signal;
   N signal selection means respectively controlled by said N bits $a_i$ for providing an output signal comprising (a) said correspondingly weighted version of said unipolar signal if the associated control bit is in a first state, or (b) said correspondingly weighted version of the constant signal if the associated control bit is in a second state; and
   shifting means for summing the outputs of said N signal selection means and for shifting said sum to produce a bipolar output signal representative of product of (a) the bipolar input signal and (b) the digital word A.

2. The multiplying digital-to-analog converter of claim 1 wherein said shifting means subtracts the sum of said N binary weighted versions of the constant signal from the sum of said outputs of said N signal selection means.

3. A multiplying digital-to-analog converter for multiplying a bipolar input current by a discrete gain factor K represented by a digital word A having N bits $a_i$, comprising:
   adding means responsive to the bipolar input current for adding a constant current to the bipolar current to produce a unipolar current;
   first weighting means responsive to said unipolar current for providing N binary weighted versions of said unipolar current;
   second weighting means for providing N binary weighted versions of the constant current;
   N current selection means respectively controlled by said N bits $a_i$ for providing an output current comprising (a) said correspondingly weighted version of said unipolar current if the associated control bit is in a first state, or (b) said correspondingly weighted version of the constant current if the associated control bit is in a second state; and
   shifting means for summing the outputs of said N current selection means and for shifting said sum to produce a bipolar output current representative of a product of (a) the bipolar input current and (b) the digital word A.

4. The multiplying digital-to-analog converter of claim 3 wherein said adding means comprises a current adder.

5. The multiplying digital-to-analog converter of claim 3 wherein said shifting means comprises a current adder that adds the sum of the outputs of the N current selection means and the negative of the sum of said binary weighted versions of the constant current.

6. A multiplying digital-to-analog converter for multiplying a bipolar input current $I_{SX}$ by a discrete gain factor K represented by a digital word A having N bits $a_i$, comprising:
   a current adder responsive to the bipolar input current for adding a constant current $I_D$ to the bipolar current to produce a unipolar current $I_{SY}$;
   first weighting means responsive to said unipolar current for providing N binary weighted currents $I_{SY}, (\frac{1}{2})^1 I_{SY}, (\frac{1}{2})^2 I_{SY}, \ldots (\frac{1}{2})^{N-1} I_{SY}$ based on the unipolar current;
   second weighting means for providing N binary weighted currents $I_D, (\frac{1}{2})^1 I_D, (\frac{1}{2})^2 I_D, \ldots (\frac{1}{2})^{N-1} I_D$ based on the constant current $I_D$;
   N current selection means respectively controlled by said N bits $a_i$ for providing an output current comprising (a) said correspondingly weighted version of said unipolar current if the associated control bit is in a first state, or (b) said correspondingly weighted version of the constant current if the associated control bit is in a second state; and
   shifting means for summing the outputs of said N current selection means and for shifting said sum to produce a bipolar output current representative of a product of (a) the bipolar input current and (b) the digital word A.

* * * * *